(12) United States Patent
Awaka et al.

(10) Patent No.: US 6,468,848 B1
(45) Date of Patent: Oct. 22, 2002

(54) METHOD OF FABRICATING ELECTRICALLY ISOLATED DOUBLE GATED TRANSISTOR

(75) Inventors: Kaoru Awaka; Masashi Hashimoto, both of Ibaraki; Masaaki Aoki, Tokyo, all of (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/851,941

(22) Filed: May 10, 2001

Related U.S. Application Data

(62) Division of application No. 09/359,000, filed on Jul. 22, 1999.
(60) Provisional application No. 60/094,787, filed on Jul. 31, 1998.

(51) Int. Cl.[7] ............................................. H01L 21/8238
(52) U.S. Cl. ........................ 438/199; 438/210; 438/237
(58) Field of Search .................................. 438/199–238

(56) References Cited

U.S. PATENT DOCUMENTS

| | | | |
|---|---|---|---|
| 4,818,714 A | * | 4/1989 | Haskell |
| 5,418,395 A | | 5/1995 | Nagata et al. ............... 257/103 |
| 5,770,490 A | * | 6/1998 | Frenette et al. ............. 438/199 |
| 5,780,899 A | | 7/1998 | Hu et al. ..................... 257/335 |
| 5,900,665 A | | 5/1999 | Tobita ......................... 257/357 |
| 5,986,932 A | | 11/1999 | Ratnakumar et al. ....... 365/185 |
| 6,091,101 A | | 7/2000 | Wang ......................... 257/315 |
| 6,166,417 A | | 12/2000 | Bai ............................. 257/407 |

OTHER PUBLICATIONS

A 1V CMOS Digital Circuits with Double–Gate–Driven MOSFET–Louis S.Y. Wong, Graham A. Rigby–1997 IEEE International Solid–State Circuits Conference, pp292, 293 and 470.

* cited by examiner

Primary Examiner—Jey Tsai
(74) Attorney, Agent, or Firm—Jacqueline J. Garner; Wade James Brady III; Frederick J. Telecky, Jr.

(57) ABSTRACT

A gated field effect transistor (gated-FET) in which the body of the FET is electrically isolated from the substrate thereby reducing leakage current through parasitic bipolar action. The back-bias of the channel of the FET is jointly controlled by a diode coupled with a capacitor.

24 Claims, 7 Drawing Sheets

METHOD OF FABRICATING ELECTRICALLY ISOLATED DOUBLE GATED TRANSISTOR

CROSS REFERENCE TO PRIOR APPLICATIONS

This application is a division of Ser. No. 09/359,000, Filed on Jul. 7, 1999 which claims priority under 35 U.S.C. 119(e)(1) based upon provisional application Ser. No. 60/094,787, filed Jul. 31, 1998.

BACKGROUND AND SUMMARY OF THE INVENTION

The present invention relates to double gated transistors and structures to lower the operating voltage while maintaining stable performance of the double gated transistor.

Background: Power Consumption in Integrated Circuits

As the size of integrated circuits shrinks, supply voltages must be scaled also. The reduction in supply voltages also puts pressure on threshold voltages.

The threshold voltage of a field effect transistor (FET) is the voltage where a transistor starts to turn on. When supply voltages (Vdd) were 5 Volts, threshold voltage magnitudes were typically around 1.1V. (That is, the threshold voltage (Vt) of an n-channel insulated gate (nMOS) transistor might be +1.1V, and the Vt of a p-channel (pMOS) transistor might be −1.1V.) Note that the supply voltage is more than the sum of the threshold voltage magnitudes: Vdd is greater than or equal to the magnitude of Vtn plus the magnitude of Vtp combined. This is an important relation for complementary MOS (CMOS) circuits, since otherwise the circuits can have metastable states where neither nMOS nor pMOS transistors are on.

With 3.3V supply voltages, threshold voltage magnitudes of around 0.8V are more typical. However, as supply voltages shrink further, the reduction in threshold voltage creates difficulties. Smaller threshold voltages have a side effect of increased leakage.

One of the most promising ways for the reduction of power is to reduce the supply voltage, which in turn degrades the speed of operation in conventional circuits. To relax this speed lowering problem, threshold voltage lowering is an effective method. This technique, however, causes the increase of leakage current as another source of power dissipation.

Several circuit architectures have been proposed to solve the above problems. Those architectures include multi-threshold CMOS (MTCMOS), variable threshold CMOS (VTCMOS), and double gate driven MOS (DGMOS).

Background: Double-Gate MOS

The circuit structure, the cross-sectional view, and the layout of the DGMOS circuit of Wong and Rigby are shown in FIG. 7. A CMOS inverter circuit with n-well process is used as an example. In the DGMOS circuits, the body of the p-channel MOS transistor is connected both to the voltage supply, Vdd, and to the input node through a diode, D1, and a capacitor, Cb, respectively, whereas in the conventional configuration, the body of the p-channel transistor is directly connected to the voltage supply. The diode D2 shown in FIG. 7 expresses the parasitic diode which exists between the source (p+diffusion) and the body (n-) of the p-channel transistor. When the input signal changes, the body bias of the transistor changes simultaneously. Thus the body bias of the p-channel transistor is controlled by the input signal and hence the threshold voltage, Vt, of the p-channel transistor changes dynamically as a result of the body biasing effect, i.e., large magnitude for Vt for Vin=Vdd and small magnitude for Vt for Vin=0. Sub-threshold leakage current of the p-channel transistor can be minimized by this technique. Here the diodes D1 and D2 try to keep the body bias between Vdd−VgP and Vdd+Vg1, where Vg1 and VgP are the cut-in voltage of the diodes D1 and D2, respectively.

In this approach, however, the chip area penalty becomes large. Also, the p-n-p bipolar transistor which consists of the p-channel source (p+) (Vdd), p-channel body (n-), and p-substrate (VbN+GND) turns on, when the p-channel body voltage goes below Vdd−VgP. This situation occurs when the input signal changes abruptly from high voltage to low voltage. This leads to undesirable current flow from the p-channel source (Vdd) to the p-substrate (GND). In addition, the method to reduce sub-threshold leakage current proposed by Wong and Rigby can not be applied to both p-channel and n-channel transistors simultaneously. The reason for this can be illustrated by way of example. If the substrate is a p-substrate, a p-MOS is implemented in an n-well and the body bias of the p-MOS can be controlled. However, if it is desired to control the body bias of an n-MOS on the same substrate, the body must be separated from the p-substrate, the bias of which is kept to ground.

Background: Multi-Threshold CMOS

The threshold voltage is the voltage where the transistor turns on. In a Multi-threshold CMOS (MT-CMOS), the two transistors which make up the CMOS circuit have different threshold voltages. High threshold voltage, Vt, transistors separate the logic block consisting of low Vt transistors from the voltage supply. When the system is in sleep mode, these high Vt transistors separate the logic block from the supply voltage and the internal states of the logic blocks are stored in the latch circuit with high Vt transistors. This reduces the current leak through the parasitic transistor of the low threshold voltage transistor.

Background: Variable-Threshold CMOS

In a variable-threshold CMOS (VT-CMOS), the transistor threshold voltage varies depending on whether the circuit is in sleep mode or in active mode. When the circuit is in sleep mode, the threshold voltage is more than it is when it is in active mode. The threshold voltage of the transistor is controlled by applying body bias from an external circuit. This requires additional circuits beyond the CMOS circuit to generate appropriate body bias.

Innovative Structures

The present application discloses a FET consisting of a gate controlling current flow through the transistor channel, a diode and a capacitor jointly controlling the back-bias of the transistor, and a barrier which electrically isolates the transistor body of one transistor from that of another transistor and from the semiconductor substrate in which the transistor lies.

Advantages of the disclosed methods and structures include low supply voltage and/or high speed operation of circuits.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Definitions

MOSFET: An insulated-gate field effect transistor.

CMOS: Complementary MOS or CMOS is a circuit containing both an nMOS and a pMOS transistor.

nMOS: An nMOS transistor is an n-channel field effect transistor.

pMOS: A pMOS transistor is a p-channel field effect transistor.

Diffusion: Diffusion is the spontaneous movement of electrons and holes through the semiconductor. In the absence of an external electric field, the electrons or holes will tend to diffuse such that they are distributed uniformly throughout the medium to reach an equilibrium.

Diffusion Layer: The region where the dopant atoms are diffused.

SOI: Silicon on insulator device. These devices have a steeper subthreshold slope than conventional bulk devices, thus reducing off-state current without increasing Vt.

TFT: TFT is a thin film transistor.

Current leakage or leakage: Current leakage is current that escapes from the device by means other than that intended such as through parasitic bipolar action.

p-channel: A channel of p-type semiconductor material induced in a FET as a result of a bias applied to the gate. This channel allows current to flow from the source to the drain.

n-channel: A channel of n-type semiconductor material induced in a FET as a result of a bias applied to the gate. This channel allows current to flow from the drain to the source.

Back-bias or Body-bias: Back-bias is the voltage applied to the semiconductor material under the gate of the FET.

I. Reduced Leakage Current DG-pMOS

Figure 1:
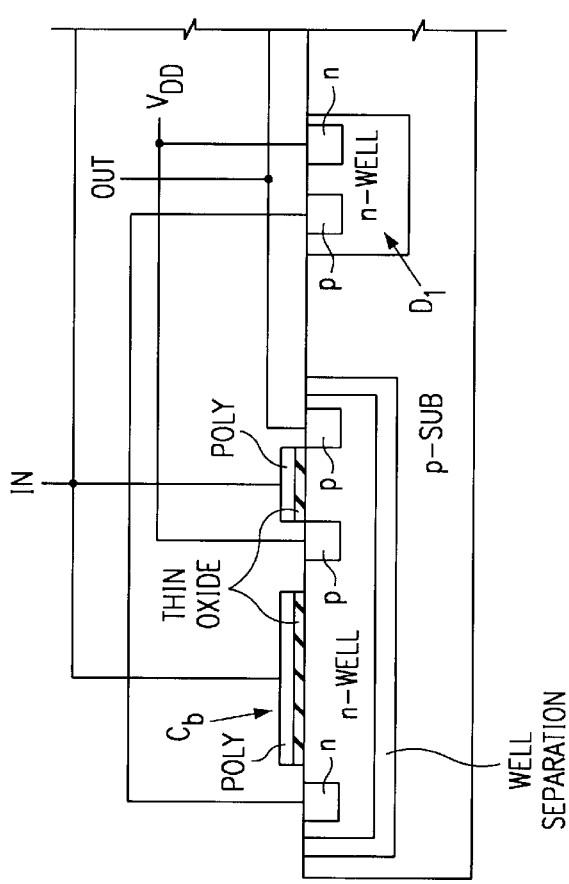
FIG. 1 depicts an improved DGMOS circuit.

FIG. 1 shows an innovative gated-FET in which the well in which a p-channel FET is built is electrically separated from the semiconductor substrate in which it sits to prevent parasitic bipolar action and a diode coupled with a capacitor is used to control the back-bias of the channel. The separation can be made either by triple-well structure, trench structure, or other materials appropriate for suppressing p-n-p bipolar action.

Figure 2A:
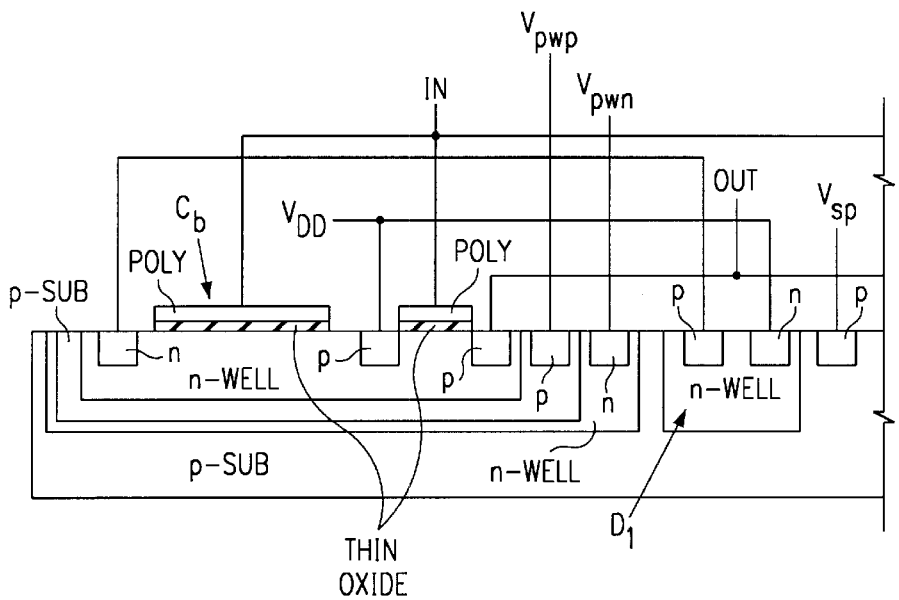
FIG. 2 depicts an example of the circuit in FIG. 1 with a triple well structure employed.
Figure 2B:
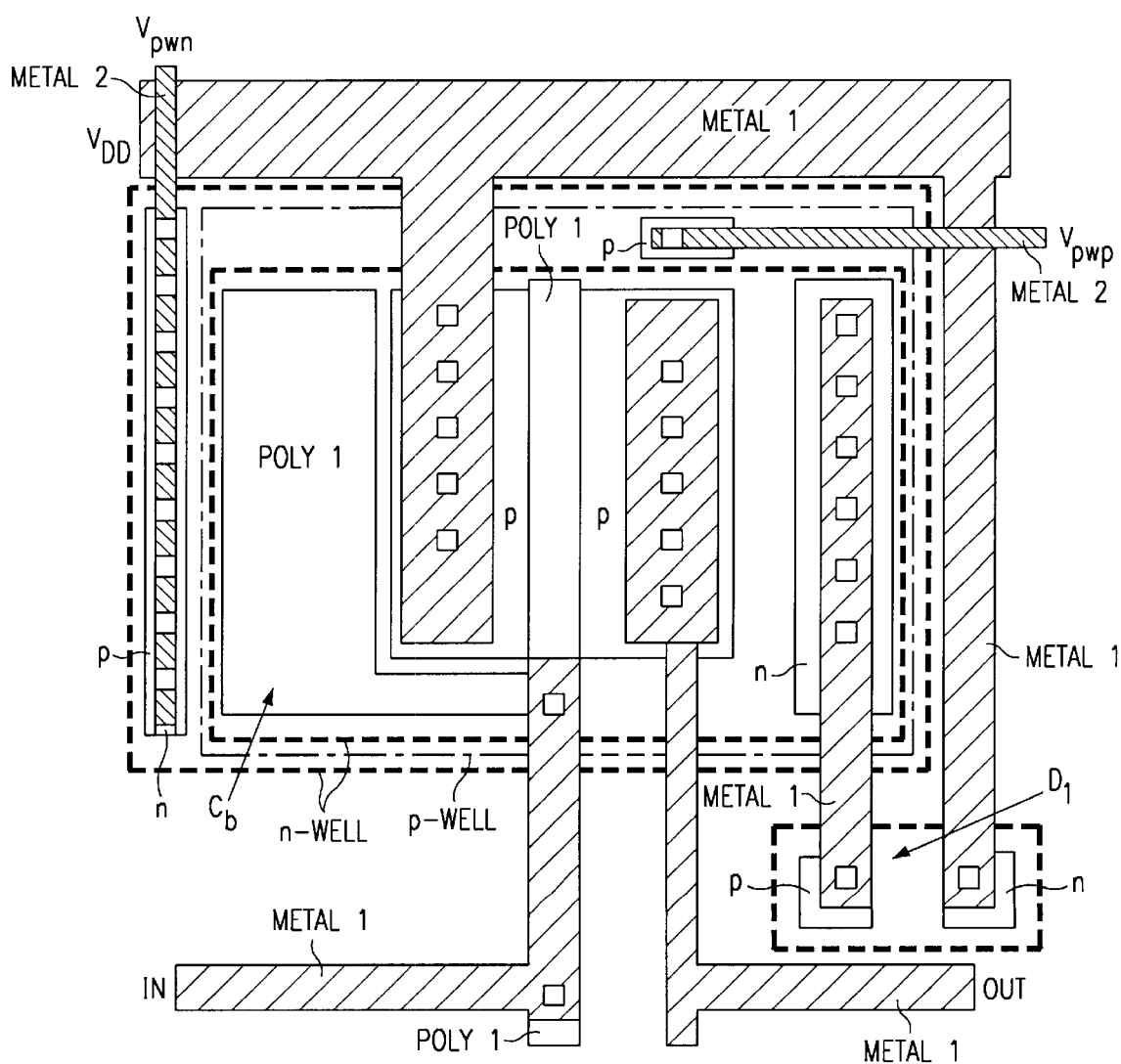

An example of a structure which employs a triple-well is shown in FIG. 2. In this example, the substrate bias, Vsp, is set to the ground and the well bias, Vpwn, is set to the supply voltage, Vdd. Therefore, power consumed by the undesirable current through the parasitic bipolar transistor is reduced when the p-well bias, Vpwp, is set to a value greater than 0 Volts. This is true because the current flowing through the parasitic transistor is smaller than it would be for the conventional case, where Vpwp=0, and also because the bias voltage is smaller than in the conventional case. To reduce the undesired current more efficiently, Vpwp is set to a value that is greater than or equal to Vdd−VgP and is less than or equal to Vdd, where VgP is the cut-in voltage of the source-body diode of the p-channel transistor.

Figure 6:
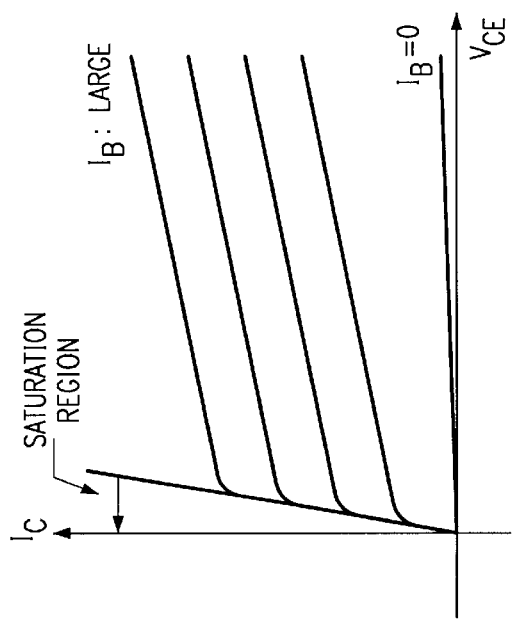
FIG. 6 depicts a graph of the collector current as a function of the voltage between collector and emitter, Vce, is shown.
Figure 7A:
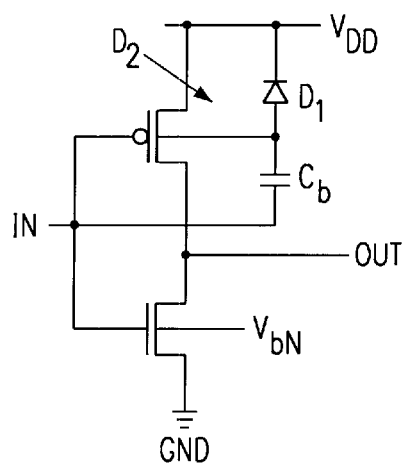
FIG. 7 depicts the DGMOS circuit proposed by Wong and Rigby.
Figure 7B:
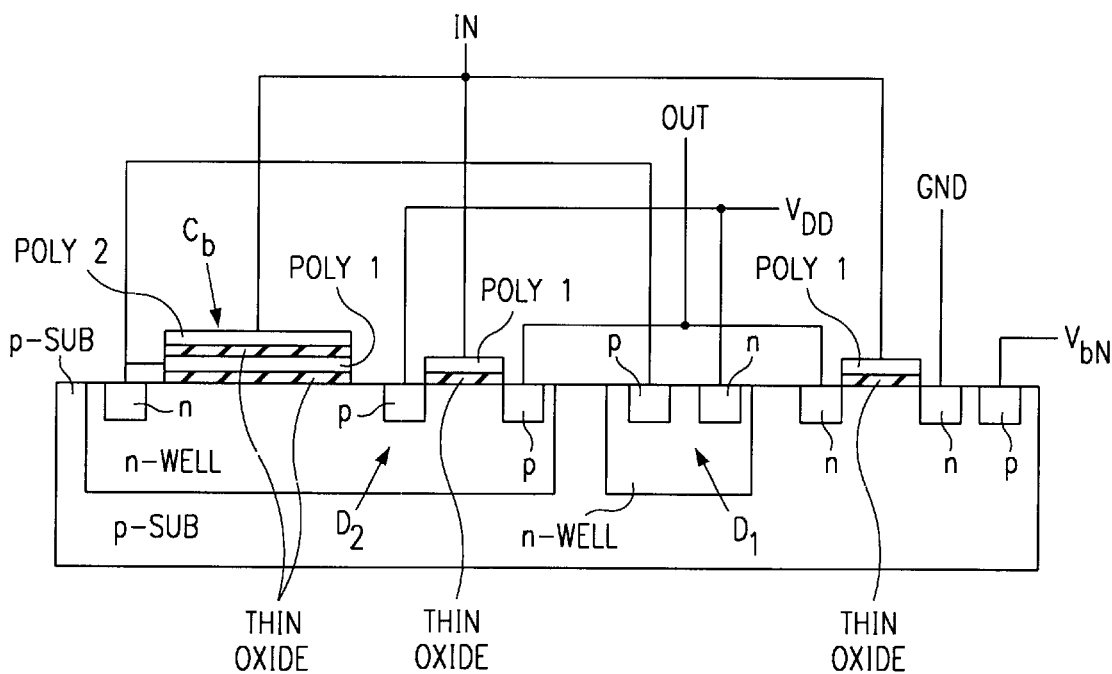
Figure 7C:
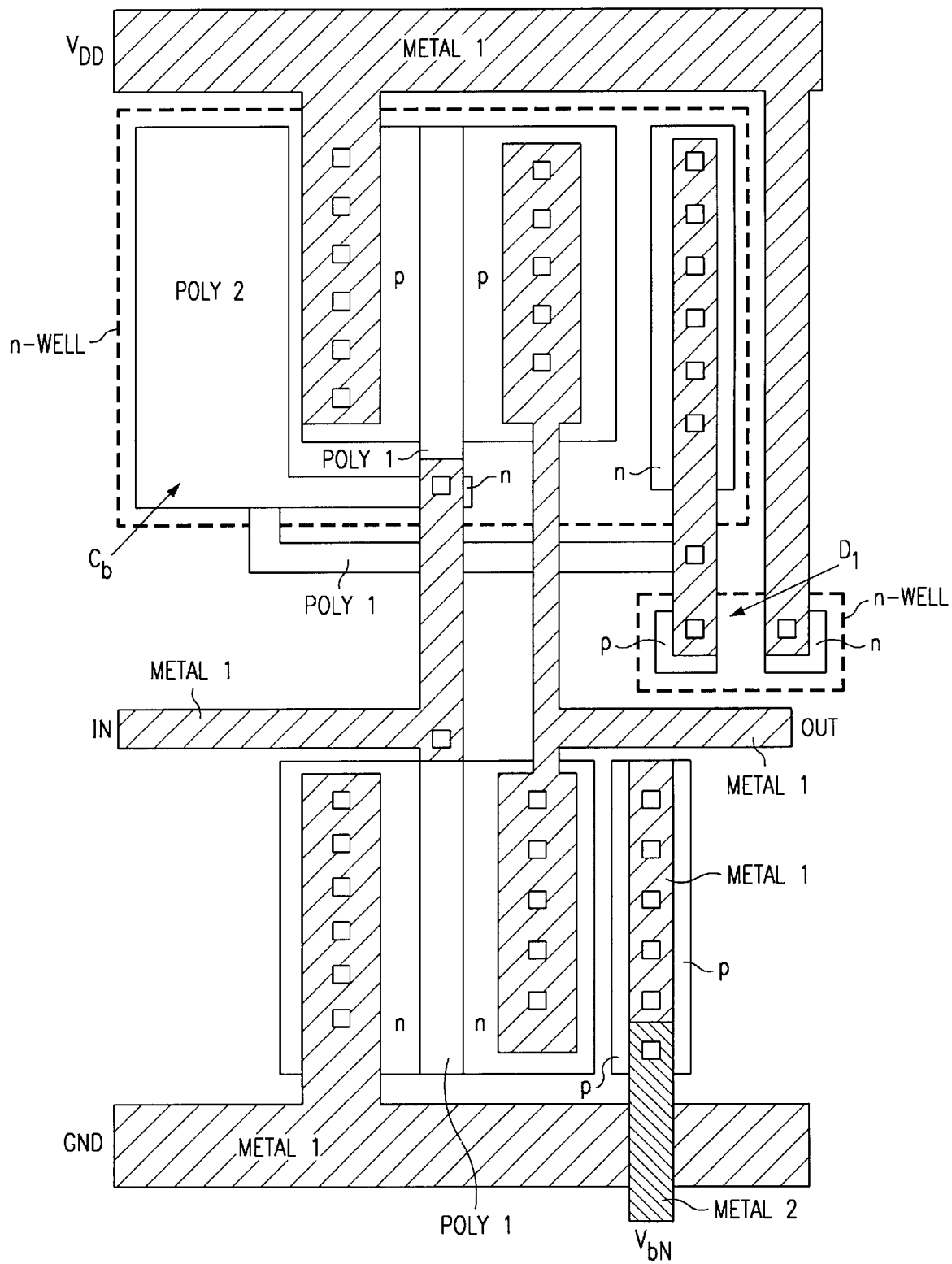

The reason to set Vpwp in this range is as follows. Consider a situation where the input signal has been kept at the high-voltage state for a long period of time and then is abruptly turned to the low-voltage state. In this case, the body voltage of the p-channel transistor becomes lower than Vdd−VgP and the parasitic bipolar transistor turns on. The amount of charge flowing from the source (emitter of the bipolar transistor) to the body (base of the bipolar transistor) cannot be reduced because it is required for the normal operation of the DG-MOS circuit. However, the charge flowing from the source to the p-well (collector of the bipolar transistor) can be reduced by operating the bipolar transistor in its saturation region. (See FIG. 6). To achieve this condition, both emitter-base junction and collector-base junction should be forward biased. The emitter-base junction is always forward biased. The collector-base junction is forward biased when the base voltage is lower than the collector voltage, Vpwp. This condition must be maintained only while the parasitic bipolar transistor is turned on, or the base voltage is lower than Vdd−VgP. Thus, the p-well bias of the p-MOS, Vpwp, is set to the previously mentioned range.

With this structure, stable operation of a double-gate p-channel metal oxide semiconductor transistor (DG-pMOS) becomes possible and also the power consumption in DG-pMOS is reduced.

II. Reduced Leakage Current DG-nMOS

Figure 3A:
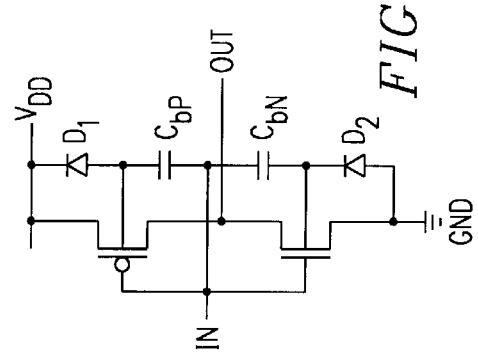
FIG. 3 depicts a schematic description of an improved DGMOS technique applied to n-channel and p-channel transistors.
Figure 3B:
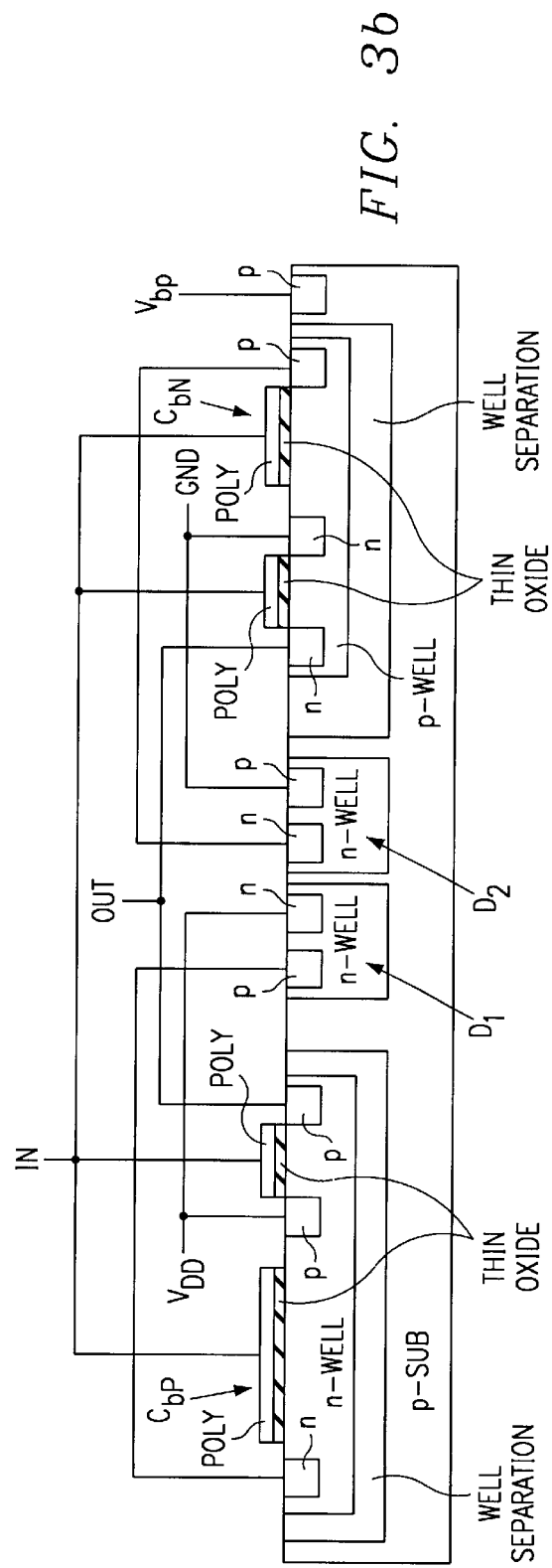

A device for reducing the leakage current of an n-channel transistor coupled with a p-channel transistor is shown in FIG. 3. A CMOS inverter circuit is shown as an example and the parasitic diodes are not shown explicitly. The application of this method to n-channel transistors is made possible by the isolation of bodies of n-channel transistors from the p-substrate. Therefore, it is not a mere replacement. The concept of leakage-current reduction in n-channel transistors is similar to that of p-channel transistors, i.e., the threshold voltage of the n-channel transistor is changed dynamically by controlling the body bias of the n-channel transistor.

Figure 4A:
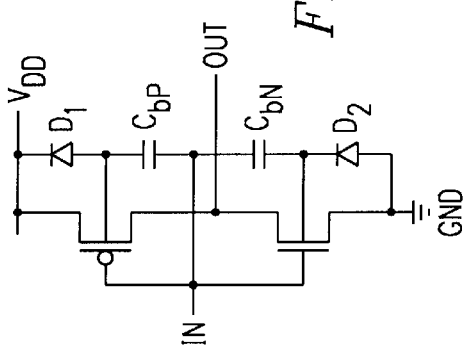
FIG. 4 depicts an example of the circuit in FIG. 6 employing a triple well structure.
Figure 4B:
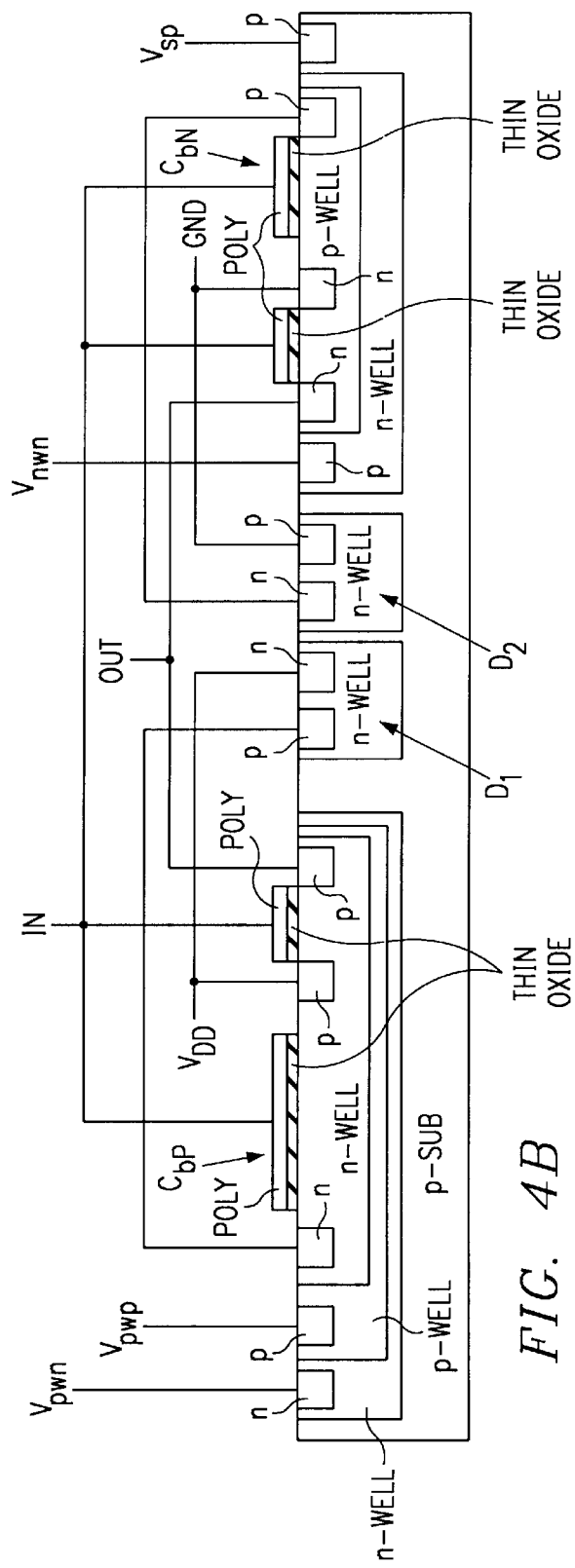
Figure 4C:
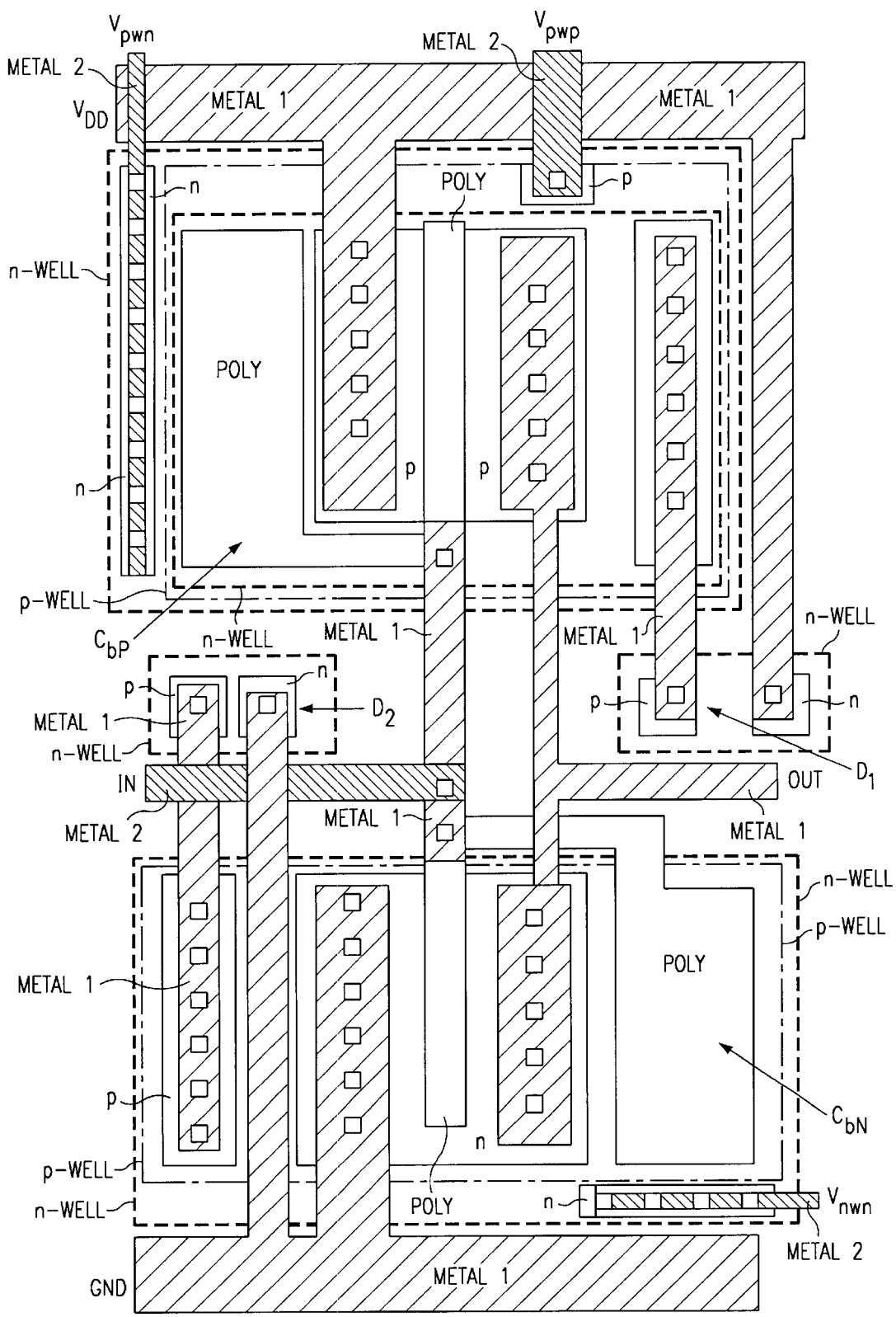

An example of a device employing triple well structure is shown in FIG. 4. The substrate voltage, Vsp, is set to ground. It is clear that power consumed by the undesirable current through the parasitic bipolar transistor is reduced when the n-well bias, Vnwn, is set to a value smaller than Vdd, because the current flowing through the parasitic transistor is smaller than that in the conventional case where Vnwn=Vdd and also because the bias voltage is smaller. To reduce the undesired current more efficiently, Vnwn, is set to be greater than or equal to zero and less than or equal to VgN, where VgN is the cut-in voltage of the source-body junction of the n-channel transistor. The well biases of the p-channel transistor are set to the same value as above.

The reason to set Vnwn in this range is as follows. Consider a situation where the input signal has been kept at the low-voltage state for a long period of time and it is abruptly turned to the high-voltage state. In this case, the body voltage of the n-channel transistor becomes higher than VgN and the parasitic bipolar transistor turns on. The amount of charge flowing from the source (emitter of the bipolar transistor) to the body (base of the bipolar transistor) cannot be reduced because it is required for the normal DG-MOS operation. However, the charge flowing from the source to the p-well (collector of the bipolar transistor) can be reduced by operating the bipolar transistor in the saturation region. To achieve this condition, both the base-emitter junction and the base-collector junction should be forward biased. The base-emitter junction is always forward biased. The base-collector junction is forward biased when the base voltage is higher than the collector voltage, Vnwn. This condition must be maintained only while the parasitic bipolar transistor is turned on or while the base voltage is higher than VgN.

Utilizing the structure described herein, the stable operation of double-gated n-channel metal oxide semiconductor transistors (DG-nMOS) becomes possible and the power consumption in DG-nMOS is reduced.

III. Reduced Leakage Current CMOS

Combining the structure described for DG-pMOS and the structure described for DG-nMOS, the stable operation of DG-CMOS becomes possible and the power consumption in DG-CMOS is reduced.

Advantages of the disclosed methods and structures include the suppression of undesirable current through parasitic bipolar transistors, which occurs using the method of Wong and Rigby, as well as the application of the technique of Wong and Rigby to both p- and n-MOSFETs which was not previously possible. Because the disclosed methods and structures may be applied to both p- and n-MOSFETs, the disclosed methods and structures require a smaller supply voltage and smaller area compared to the method of Wong and Rigby.

In the method of Mutoh et al., low supply voltage and high speed operation of CMOS logic are implemented by using two kinds of transistors with different threshold voltages. This method requires additional circuits for the latch and also complex processes to make two kinds of transistors with different threshold voltages. In the disclosed methods and structures, however, such additional circuits are not required.

In the method of Kuroda et al., the threshold voltage of the transistor is controlled by applying body bias from the external circuit. For the implementation of this method, additional circuits to generate appropriate body bias are required. In the disclosed methods and structures, however, such additional circuitry is not necessary.

Alternative Embodiment: Trench Isolation

Figure 5:
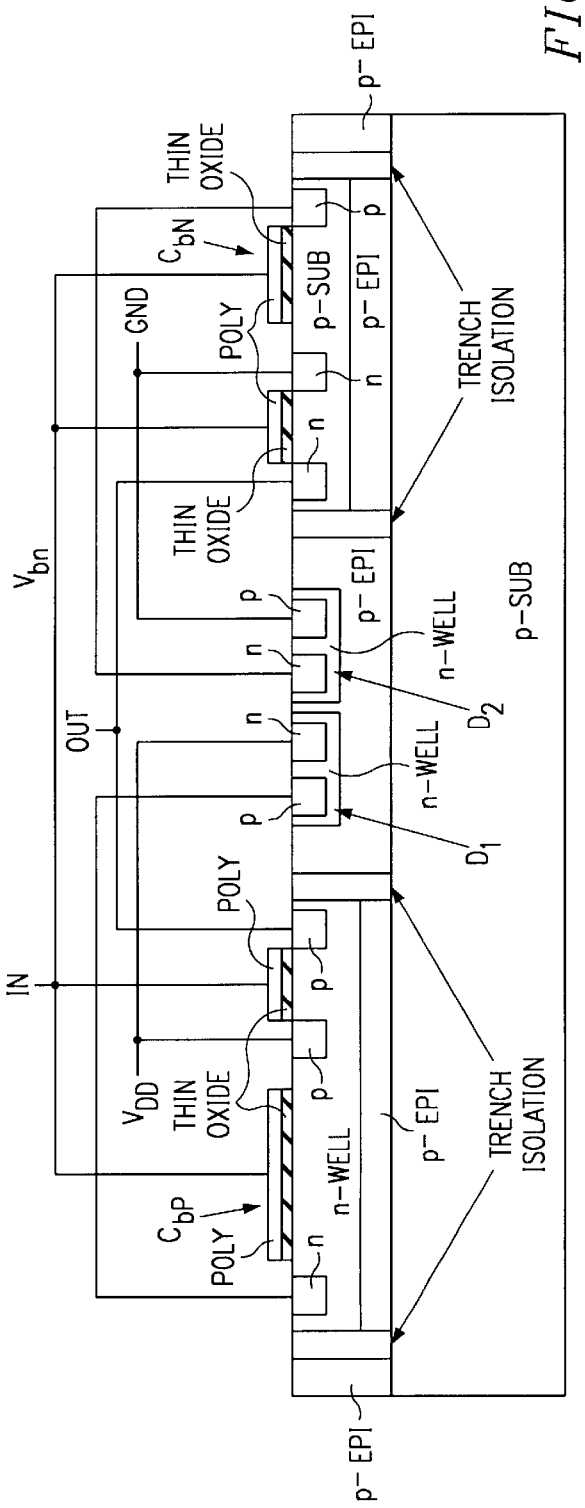
FIG. 5 depicts an example of DGMOS with trench isolation.

In an alternate embodiment, the transistor well is electrically separated from the semiconductor substrate by means of a trench structure. An example of a DG-CMOS employing trench isolation as the separator of the transistor well from the substrate is shown in FIG. 5. By the trench isolation, the well becomes floating and there is no parasitic bipolar transistor in the structure. This embodiment of the invention requires a simpler structure than that needed using the triple well structure.

According to a disclosed class of innovative embodiments, there is provided: a transistor, comprising: (a.) a gate which controls current flow through a transistor channel; (b.) a diode, and an additional coupling capacitance, which jointly control the back-bias of said channel; (c.) wherein said channel is constructed in, and electrically isolated from, a body of semiconductor material.

According to another disclosed class of innovative embodiments, there is provided: a double-gate-driven FET, comprising: (a.) a semiconductor substrate; (b.) a first-conductivity-type well diffusion layer in said substrate; (c.) two second-conductivity-type source/drain diffusion layers in said well diffusion layer, defining a channel therebetween; (d.) a gate connected to said well diffusion layer to control inversion of said channel; (e.) a diode, and an additional coupling capacitance, which jointly control the back-bias of said channel; (f.) wherein said well diffusion layer is isolated from said substrate.

According to another disclosed class of innovative embodiments, there is provided: a double-gate-driven p-channel FET, comprising: (a.) a semiconductor substrate; (b.) an n-type well diffusion layer in said substrate; (c.) two p-type source/drain diffusion layers in said well diffusion layer, defining a channel therebetween; (d.) a gate connected to said well diffusion layer to control inversion of said channel; (e.) a diode, and an additional coupling capacitance, which jointly control the back-bias of said channel; (f.) wherein said well diffusion layer is isolated from said substrate.

According to another disclosed class of innovative embodiments, there is provided: a method of forming a transistor, comprising the action of: (a.) forming a transistor in a body of semiconductor material; (b.) forming a transistor channel which is electrically isolated from said semiconductor material; (c.) forming a gate which controls current flow through a transistor channel; and (d.) forming a diode, and forming an additional coupling capacitance, which jointly control the back-bias of said channel.

According to another disclosed class of innovative embodiments, there is provided: a method of forming a double-gate-driven FET, comprising the action of: (a.) forming a semiconductor substrate; (b.) forming a first-conductivity-type well diffusion layer in said substrate such that said well diffusion layer is isolated from said substrate; (c.) forming two second-conductivity-type source/drain diffusion layers in said well diffusion layer, defining a channel therebetween; (d.) forming a gate connected to said well diffusion layer to control inversion of said channel; and (e.) forming a diode and a capacitor which jointly control the back-bias of said channel.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

Although the device has been described with reference to a p-substrate device, the device can also be applied to an n-substrate device. Furthermore, the device can also be applied to SOI and to TFT devices. It should also be noted that the device operates for all values of voltages that satisfy the given conditions. Additionally, it should be noted that the body of semiconductor from which the transistor is constructed can be monocrystalline or polycrystalline.

What is claimed is:

1. A method of fabricating a double-gate-driven FET, comprising the steps of:
   (a.) providing a semiconductor substrate biased to a reference voltage;
   (b.) forming a first well diffusion layer of first conductivity type in said substrate biased to a supply voltage;
   (c.) forming a second well diffusion layer of opposite conductivity type in said first n-type well diffusion layer electrically isolated from said substrate;
   (d.) forming a third well diffusion layer of first conductivity type in said second well diffusion layer;
   (e.) forming two source/drain diffusion layers in said third well diffusion layer of opposite conductivity type defining a channel therebetween;
   (f.) forming a gate coupled to said third diffusion layer to control inversion of said channel;
   (g.) forming a diode and an additional coupling capacitance; and
   (h.) jointly controlling the back-bias of said channel with said diode and additional coupling capacitance;
   (i.) said second well diffusion layer being biased to a value greater than or equal to the magnitude of the supply voltage minus the magnitude of a cut-in voltage of said diode.

2. The method of claim 1 wherein said first conductivity type is p-type and said opposite conductivity type is n-type.

3. The method of claim 1 wherein said first conductivity type is n-type and said opposite conductivity type is p-type.

4. The method of claim 1 wherein said reference voltage is ground.

5. The method of claim 2 wherein said reference voltage is ground.

6. The method of claim 3 wherein said reference voltage is ground.

7. The method of claim 1 further including the step of providing a triple well structure electrically isolating said channel from the portion of said substrate external to said first well.

8. The method of claim 2 further including the step of providing a triple well structure electrically isolating said channel from the portion of said substrate external to said first well.

9. The method of claim 3 further including the step of providing a triple well structure electrically isolating said channel from the portion of said substrate external to said first well.

10. The method of claim 4 further including the step of providing a triple well structure electrically isolating said channel from the portion of said substrate external to said first well.

11. The method of claim 5 further including the step of providing a triple well structure electrically isolating said channel from the portion of said substrate external to said first well.

12. The method of claim 6 further including the step of providing a triple well structure electrically isolating said channel from the portion of said substrate external to said first well.

13. The method of claim 1 further including the step of providing a common source of voltage coupled to both said diode and one of said source/drain regions.

14. The method of claim 2 further including the step of providing a common source of voltage coupled to both said diode and one of said source/drain regions.

15. The method of claim 3 further including the step of providing a common source of voltage coupled to both said diode and one of said source/drain regions.

16. The method of claim 4 further including the step of providing a common source of voltage coupled to both said diode and one of said source/drain regions.

17. The method of claim 5 further including the step of providing a common source of voltage coupled to both said diode and one of said source/drain regions.

18. The method of claim 6 further including the step of providing a common source of voltage coupled to both said diode and one of said source/drain regions.

19. The method of claim 7 further including the step of providing a common source of voltage coupled to both said diode and one of said source/drain regions.

20. The method of claim 8 further including the step of providing a common source of voltage coupled to both said diode and one of said source/drain regions.

21. The method of claim 9 further including the step of providing a common source of voltage coupled to both said diode and one of said source/drain regions.

22. The method of claim 10 further including the step of providing a common source of voltage coupled to both said diode and one of said source/drain regions.

23. The method of claim 11 further including the step of providing a common source of voltage coupled to both said diode and one of said source/drain regions.

24. The method of claim 12 further including the step of providing a common source of voltage coupled to both said diode and one of said source/drain regions.

* * * * *